United States Patent
Nagai et al.

[11] Patent Number: 5,263,240
[45] Date of Patent: Nov. 23, 1993

[54] METHOD OF MANUFACTURING PRINTED WIRING BOARDS FOR MOTORS

[75] Inventors: Fumio Nagai; Hiromitsu Nakayama, both of Saitama, Japan

[73] Assignee: Nippon CMK Corp., Japan

[21] Appl. No.: 869,653

[22] Filed: Apr. 16, 1992

[30] Foreign Application Priority Data

Sep. 20, 1991 [JP] Japan .................. 3-268999

[51] Int. Cl.$^5$ .............................................. H05K 3/40
[52] U.S. Cl. ...................................... 29/593; 29/846; 324/545; 324/546
[58] Field of Search ...................... 29/593, 846, 847; 324/545, 546; 310/DIG. 6, 68.2

[56] References Cited

U.S. PATENT DOCUMENTS

| | | | |
|---|---|---|---|
| 4,975,607 | 12/1990 | Hara et al. | 29/846 |
| 5,072,185 | 12/1991 | Rockwell | 29/593 |
| 5,126,613 | 6/1992 | Choi | 310/68 R |

FOREIGN PATENT DOCUMENTS 4032541 11/1991 Japan ....................... 29/593

Primary Examiner—Mark Rosenbaum
Assistant Examiner—Kenneth J. Hansen
Attorney, Agent, or Firm—Bruce L. Adams; Van C. Wilks

[57] ABSTRACT

Circuit ends of a cancel loop circuit and a frequency generator circuit are connected with circuit lands in such a manner that the two circuits are not allowed to electrically communicate with each other. The cancel loop circuit and the frequency generator circuit are subjected to an electrical conductivity test to detect any short circuit therebetween. After successful testing, the lands located adjacent each other at one side of the circuits are connected with each other, thereby electrically communicating the cancel loop circuit and the frequency generator circuit to obtain a completed coil circuit.

7 Claims, 2 Drawing Sheets

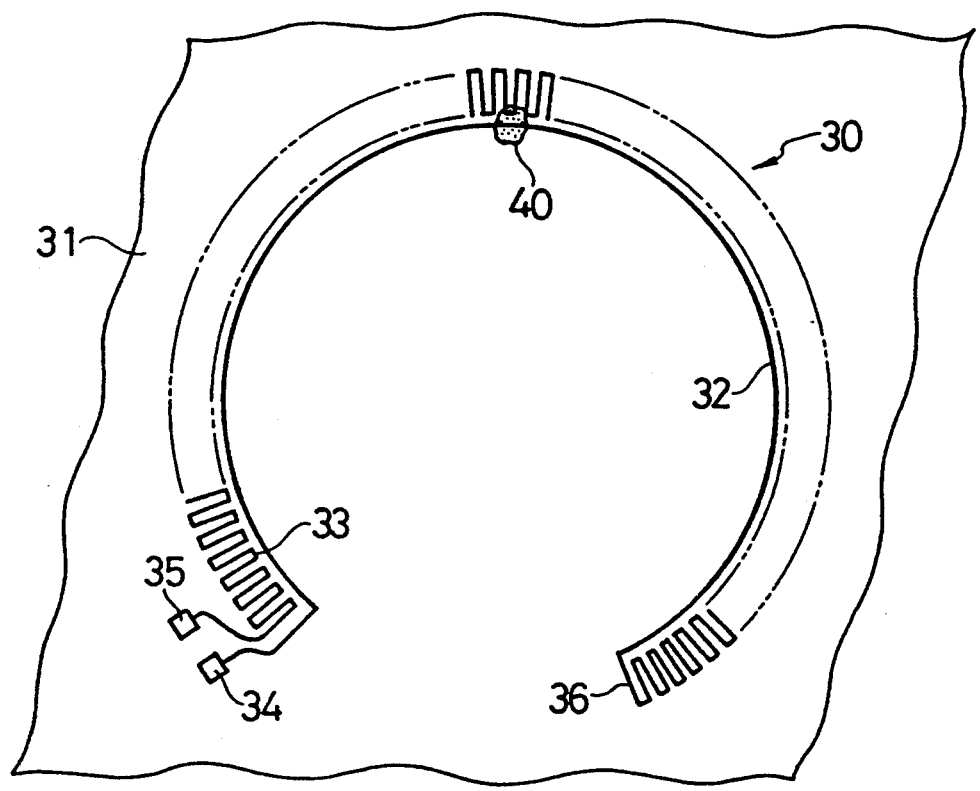

METHOD OF MANUFACTURING PRINTED WIRING BOARDS FOR MOTORS

BACKGROUND OF THE INVENTION

Field of the Invention

The present invention is directed to a method of manufacturing printed wiring boards which control the drive of motors incorporated in a floppy disk drive, a compact disk drive, a VTR apparatus or the like.

Description of the Related Arts

Motors for rotating storage media such as floppy disks receive signals from printed wiring boards for motors, to control the drive thereof. FIG. 3 shows a coil circuit 30 of the printed wiring board. The coil circuit 30 comprises a substrate 31, a cancel loop circuit 32 and frequency generat FG circuit 33 provided on the substrate 31 in a parallel manner. The cancel loop circuit 32 is arcuate, while the (FG) circuit extends to form a continuous alternating rectangular corrugation around the cancel loop circuit 32. Circuit ends located at one side of the cancel loop circuit 32 and the FG circuit 33 are respectively connected with lands 34 and 35 formed on the substrate 31, while circuit ends located at the other side are electronically connected with each other by way of a connection wire 36. Such coil circuit 30 must to be subjected to electrical tests for open circuiting disconnection and short circuiting. To perform the electrical tests check-pins (not shown) of a tester or the like are brought into contact with the lands 34 and 35 for the application of voltage.

When the coil circuit 30 is electrically tested, a disconnection (open circuit) is easy to detect, but a short circuit is difficult to detect. This arises from the fact that even though there may exist a short circuit region designated as reference numeral 40 in FIG. 3, electrical continuity exist of the short circuit region 40 as if there were no electrical short, since the cancel loop circuit 32 ad the FG circuit 33 are electrically connected through the connection wire 36. This short circuit unconspicuously damages the function of the coil circuit 30, and therefore the defect is not detected until the printed wiring board has been loaded into the equipment of which it is a part.

SUMMARY OF THE INVENTION

The present invention was conceived in view of the above-mentioned shortcomings in the prior art, and it is an object of the present invention to provide a method of manufacturing printed wiring boards for motors, capable of simply and accurately detecting a short circuit between the cancel, loop circuit and the FG circuit during the process of manufacture the printed wiring boards.

The present invention is characterized by a method of manufacturing printed wiring boards for motors, comprising the steps of:

forming a cancel loop circuit and an FG circuit on a substrate in a parallel manner so that their respective circuit ends are connected to corresponding lands provided independently of each other;

performing an electrical conducting test separately for the cancel loop circuit and the FG circuit by bringing a check-pin into contact with said lands; and connecting said lands located at one side of the cancel loop circuit and the FG circuit with each other through a connection circuit.

During the processes of forming cancel loop circuit and the FG circuit, these circuits are electrically independent of each other and thus are not allowed to electrically communicate with each other. An electrical conducting test is carried out separately for each of the circuits under such conditions as to accurately detect a short circuit in those individual circuits. After the testing, a connection circuit is provided to electrically connect the cancel loop circuit with the FG circuit, thus forming a coil circuit.

BRIEF DESCRIPTION OF THE DRAWINGS

FIG. 3 is a top plan view of the circuit in accordance with the conventional manufacturing method.

DESCRIPTION OF THE PREFERRED EMBODIMENTS

Figure 1:
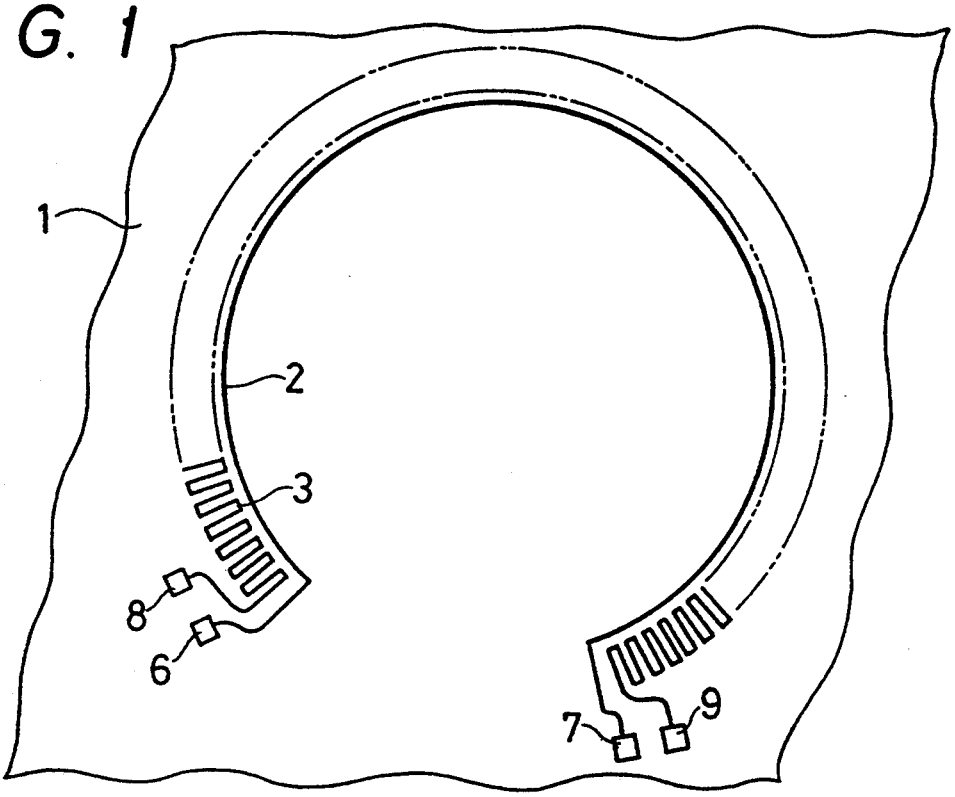
FIG. 1 is a top plan view showing an embodiment of the manufacturing process according to the present invention at a time prior to carrying out electrical conducting tests.
Figure 2:
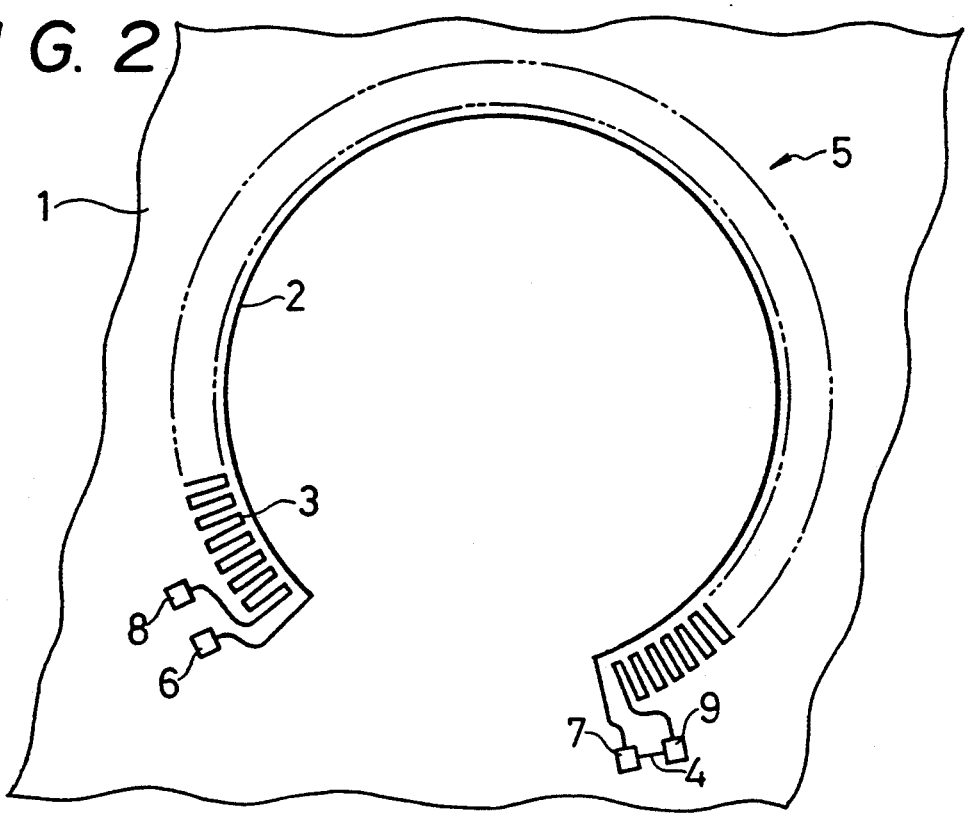
FIG. 2 is a top plan view showing an embodiment of the manufacturing process according to the present invention at a time subsequent to carrying out electrical conducting tests.

FIG. 1 and FIG. 2 illustrate an embodiment of the manufacturing method in accordance with the present invention. A cancel loop circuit 2 and an FG circuit 3 are oriented in a parallel and concentric manner. The cancel loop circuit 2 is arcuately formed internally, while the FG circuit 3 is shaped into a corrugation of continuous alternating rectangles. FIG. 1 shows a state where the cancel loop circuit 2 is not in electrical communication with the FG circuit, that is, the former is electrically independent of the latter, and FIG. 2 shows a state where the formation of a connection circuit 4 following the process shown in FIG. 1 allows the cancel circuit 2 and FG circuit 3 to be electrically communicated with each other to complete a coil circuit 5.

Referring to these drawings, the manufacture of printed wiring boards for motors will be described in the order of execution of the process steps. First, in the same manner as in the conventional process, the entire surface of a copper-clad laminate is silk-screened with a photosensitive ink and exposed to light through a photomask for development, and subjected to an etching treatment to form the cancel loop circuit 2 and the FG circuit 3 on the substrate 1. During the formation of these circuits, the cancel loop circuit 2 and the FG circuit 3 are kept electrically independent of each other. Circuit ends of the cancel loop circuit 2 and the FG circuit 3 are respectively connected to lands 6, 7 and 8, 9 provided on the substrate 1. In FIG. 1 the lands 6 and 7 are designed to be connected to the respective ends of the cancel loop circuit 2, while lands 8 and 9 are designed to be connected to the respective ends of the FG circuit 3. These lands 6, 7 and 8, 9 are formed on the substrate 1 simultaneously with the formation of the cancel loop 2 and the FG circuit 3, which are electrically independent of one another.

After the formation of the circuits independently of each other as shown in FIG. 1, the cancel loop circuit 2 and the FG circuit 3 are separately tested. To perform this testing, check-pins (not shown) of a tester or the like are brought into contact with the lands 6 and 7 at the circuit ends of the cancel loop circuit 2 to thereby close the cancel loop circuit 2. In the same manner, the check pins are then brought into contact with the lands 8 and 9 of the FG circuit 3. Such conducting tests are separately carried out for the circuits 2 and 3 which are still electrically independent of each other, thereby independently checking for faults or disconnections in each of the circuits 2 and 3. Subsequently, the check-pins are brought into contact with either of the lands (e.g., the land 6) of the cancel loop circuit 2 and either of the lends (e.g., the land 8) of the FG circuit 3. In this case, if the cancel loop circuit 2 and FG circuit 3 are free from any faults, no electrical conduction is seen therebetween, whereas if there is a short between the circuits 2 and 3, electrical conduction takes place. It is thus possible to easily and accurately check whether there exists a short circuit or not. Therefore, this inspection enables defective goods to be singled out and rejected.

After such inspection, a connection circuit 4 is formed to allow the cancel loop circuit 2 and the FG circuit 3 to electrically communicate with each other (Refer to FIG. 2). The connection circuit 4 is formed to connect the lands at one end of the cancel loop circuit 2 and FG circuit 3 (for example the land 7 and land 9 located on the right hand side in the drawing). To provide the connection circuit 4, an electrically conductive paste may be passed between the lands through a jumper wire, the adjacent lands may be soldered with the aid of a soldering wire, or the adjacent lands may be connected by means of a chip. The formation of the connection circuit 4 allows the cancel loop circuit 2 and the FG circuit 3 to be electrically communicated with each other, thus forming the coil circuit 5. After the completion of the coil circuit 5, a conducting test is performed through the lands which have not been connected for example, (the lands 6 and 8 located on the left hand side in FIG. 2) for checking the condition of the connection attained by the connection circuit 4. Thereafter, the coil circuit 5 is overcoated with an insulating paste in accordance with a conventional means.

In the manufacturing method described above, a conducting test is executed on the cancel loop circuit 2 and FG circuit 3 which are not electrically communicated with each other for the accurate detection of a short circuit between the loop and FG circuits, and thereafter, these circuits are electrically connected with each other to form a coil circuit. This enables defective goods to be detected during the manufacturing process, which eliminates an inconvenience that the defect in the goods might otherwise be detected after being loaded into the equipment.

In the present invention, the cancel loop circuit and the FG circuit, which are not allowed to electrically communicate with each other, are separately subjected to an electrical conducting test for detection of a short circuit, and thereafter the cancel loop circuit and the FG circuit are electrically connected, so that a short circuit can be accurately detected during the manufacture of printed wiring boards, thereby preventing the defective goods from being loaded into equipment.

What is claimed is:

1. A method of manufacturing printed wiring boards for motors, comprising the steps of:
   forming a cancel loop circuit and a frequency generator circuit on a substrate in a parallel manner so that their respective circuit ends are connected to corresponding lands provided independently of each other;
   performing an electrical conducting test separately for the cancel loop circuit and the frequency generator circuit by bringing a check-pin into contact with said lands; and
   connecting said lands located at one side of the cancel loop circuit and the frequency generator circuit with each other through a connection circuit.

2. A method for manufacturing a printed wiring board, comprising the steps:
   providing an electrically insulative substrate;
   forming a pair of electrically parallel circuits on the substrate, each circuit having two circuit ends and each circuit end being connected to its own circuit land;
   performing a separate electrical conductivity test for each of the pair of circuits; and
   forming a composite circuit by electrically connecting the pair of circuits together.

3. A method for manufacturing a printed wiring board according to claim 2, wherein the performing step comprises,
   bringing check pins of a tester into contact with the circuit lands at each end of one of the circuits so as to close that circuit,
   bringing check pins of the tester into contact with the circuit lands at each end of the other of the circuits so as to close that circuit, and
   bringing check pins of the tester into contact with a circuit land of one circuit and a circuit land of the other circuit so as to check for a short circuit between the two circuits.

4. A method for manufacturing a printed wiring board according to claim 2, wherein the forming step comprises electrically connecting adjacent lands at one end of each of the two circuits to form the composite circuit.

5. A method for manufacturing a printed wiring board according to claim 4, wherein electrically connecting adjacent lands comprises passing an electrically conductive paste between the adjacent lands through a jumper wire or soldering together the adjacent lands.

6. A method for manufacturing a printed wiring board according to claim 4, further including performing an electrical conductivity test of the composite circuit by bringing check pins of a tester into contact with adjacent lands at the other end of each of the two circuits so as to close the composite circuit.

7. A method for manufacturing a printed wiring board according to claim 2, further including performing an electrical conductivity test of the composite circuit.

* * * * *